United States Patent
Faralli et al.

(10) Patent No.: US 9,321,628 B2
(45) Date of Patent: Apr. 26, 2016

(54) MEMS DEVICE INCORPORATING A FLUIDIC PATH, AND MANUFACTURING PROCESS THEREOF

(71) Applicants: STMicroelectronics S.r.l., Agrate Brianza (IT); STMicroelectronics International N.V., Schiphol (NL)

(72) Inventors: Dino Faralli, Milan (IT); Benedetto Vigna, Potenza (IT); Laura Maria Castoldi, Abbiategrasso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/316,583

(22) Filed: Jun. 26, 2014

(65) Prior Publication Data

US 2015/0001645 A1  Jan. 1, 2015

(30) Foreign Application Priority Data

Jun. 28, 2013 (IT) .............................. TO2013A0539

(51) Int. Cl.
*B81B 7/00* (2006.01)
*B81C 1/00* (2006.01)

(52) U.S. Cl.
CPC ........... *B81B 7/0061* (2013.01); *B81C 1/00269* (2013.01); *B81B 2201/0264* (2013.01); *B81B 2203/0127* (2013.01); *B81B 2207/012* (2013.01); *B81C 2203/0118* (2013.01)

(58) Field of Classification Search
CPC ..................................................... B81B 7/0061

USPC ............................................. 257/415; 438/53
See application file for complete search history.

(56) References Cited

U.S. PATENT DOCUMENTS

| | | | |
|---|---|---|---|
| 5,600,174 A | 2/1997 | Reay et al. | |
| 8,049,287 B2 | 11/2011 | Combi et al. | |
| 2005/0186703 A1 | 8/2005 | Weiblen et al. | |
| 2010/0038733 A1 | 2/2010 | Minervini | |
| 2013/0168840 A1 | 7/2013 | Merassi et al. | |
| 2013/0276544 A1* | 10/2013 | Potasek et al. | 73/715 |
| 2013/0283912 A1* | 10/2013 | Lin | 73/514.16 |
| 2013/0313700 A1* | 11/2013 | Hooper et al. | 257/704 |

FOREIGN PATENT DOCUMENTS

| | | |
|---|---|---|
| EP | 1 577 656 A1 | 9/2005 |
| WO | 2007/042336 A2 | 4/2007 |
| WO | 2012/001642 A2 | 1/2012 |

* cited by examiner

*Primary Examiner* — Edward Wojciechowicz
(74) *Attorney, Agent, or Firm* — Seed Intellectual Property Law Group PLLC

(57) ABSTRACT

A MEMS device wherein a die of semiconductor material has a first face and a second face. A membrane is formed in or on the die and faces the first surface. A cap is fixed to the first face of the first die and is spaced apart from the membrane by a space. The die is fixed, on its second face, to an ASIC, which integrates a circuit for processing the signals generated by the die. The ASIC is in turn fixed on a support. A packaging region coats the die, the cap, and the ASIC and seals them from the outside environment. A fluidic path is formed through the support, the ASIC, and the first die, and connects the membrane and the first face of the die with the outside, without requiring holes in the cap.

18 Claims, 4 Drawing Sheets

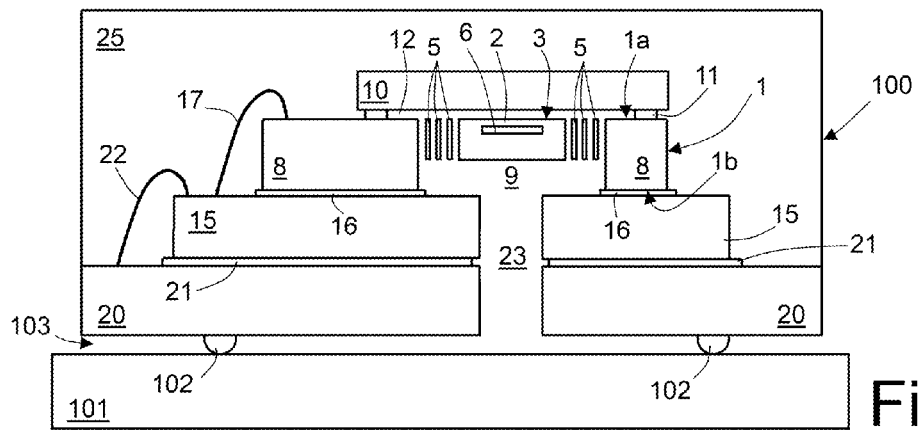

MEMS DEVICE INCORPORATING A FLUIDIC PATH, AND MANUFACTURING PROCESS THEREOF

BACKGROUND

1. Technical Field

The present disclosure relates to a MEMS device incorporating a fluidic path and to the manufacturing process thereof. In particular, the following description makes reference, without any loss of generality, to assembling of a MEMS pressure sensor of a packaged type.

2. Description of the Related Art

Sensors are known that include micromechanical structures made, at least in part, of semiconductor materials and using MEMS (micro-electro-mechanical systems) technology. Specifically, pressure sensors made using the MEMS technology typically find use in the medical field, in household apparatus, in consumer electronics (cellphones, personal digital assistants—PDAs), and in the automotive field. In particular, in the latter sector, pressure sensors are traditionally used for detecting the pressure of tires of vehicles, and are used by the control unit for signaling alarms. Pressure sensors are used also for monitoring the pressure of air-bags, for controlling the failure pressure of the ABS system, and for monitoring the engine-oil pressure, the fuel-injection pressure, etc.

A MEMS sensor generally comprises a micromechanical detection structure, which transduces a mechanical quantity to be detected (for example, a set of acoustic waves, a pressure, etc.) into an electrical quantity (for example, correlated to a capacitive variation); and an electronic reading circuit, usually made as an ASIC (Application-Specific Integrated Circuit), which performs processing operations (including amplification and filtering) of the electrical quantity and supplies an electrical output signal of an analogue type (for example, a voltage) or digital type (for example, a PDM (pulse-density modulation) signal. The electrical signal, possibly further processed by an electronic interface circuit, is then made available to an external electronic system, for example a microprocessor control circuit of the electronic apparatus incorporating the sensor.

To detect the mechanical quantity, the MEMS structure comprises a membrane formed in or on a semiconductor die and suspended over a cavity. The membrane moreover faces the external environment or is in communication with the latter through a fluidic path, as shown, for instance, in U.S. Pat. No. 8,049,287. filed in the name of the present applicant, disclosing a detection structure including a MEMS pressure sensor, of a differential capacitive type. In particular, in U.S. Pat. No. 8,049,287. the membrane faces a chamber formed in a protective cap fixed at the top to the die or faces a cavity etched from the back of the die and connected with the outside through a hole which extends through supporting elements.

The known MEMS structure, dedicated to detecting differential pressures, may be modified for detecting absolute pressures and may moreover undergo improvement as regards the simplicity of manufacture. In fact, the presence of a hole in the cap typically involves a complex molding of a packaging region, which has to be formed flush with the cap in order to prevent occlusion of the hole therein and is thus generally replaced by bonding of pre-shaped caps. Furthermore, the formation of the membrane facing the rear cavity is difficult to obtain since control of the thickness of the membrane, formed by deep etching from the back of the substrate, is complex.

BRIEF SUMMARY

One or more embodiments of the present disclosure a MEMS device is directed to incorporating a fluidic path and the corresponding manufacturing process. One embodiment is directed to a MEMS device comprising a first die of semiconductor material having a first face and a second face. A membrane is formed in or on the first die and facing the first face. A cap is fixedly coupled to the first die, facing the first face of the first die and spaced apart from the membrane by a space. A support is coupled to the first die and facing the second face of the first die. The MEMS device includes a fluidic path extending through the support and the first die and connecting the membrane to the outside of the MEMS device.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIG. 1 is a cross-section through an embodiment of the present MEMS device;

FIG. 2 is a cross-section of a different embodiment of the present MEMS device;

FIG. 3 is a cross-section of another embodiment of the present MEMS device;

DETAILED DESCRIPTION

Figure 4:
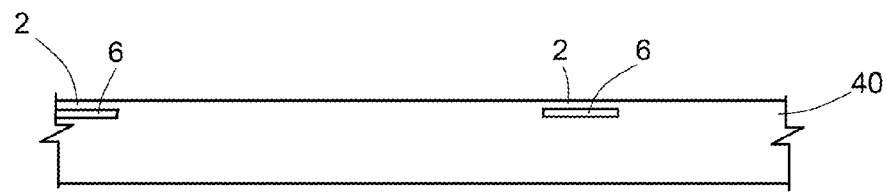
FIGS. 4-6 and 8-12 show cross-sections during successive manufacturing steps of the MEMS device of FIGS. 1 and 2.

FIG. 1 shows a MEMS device 100, such as a packaged absolute pressure sensor, fixed on a supporting body 101, formed, for example, by a printed-circuit board.

The MEMS device 100 is fixed to the supporting body 101 through adhesive regions, such as conductive adhesive regions 102 (for example, of Au, Cu or Sn), that keep the MEMS device 100 raised with respect to the supporting body 101, thus creating a gap 103 between them. The adhesive regions 102 are spaced from each other so that the gap 103 is in fluid communication with an environment outside of the MEMS device 100. The number and spacing of the adhesive regions 102 may vary. In general, the adhesive regions 102 provide suitable adhesion between the supporting body 101 and MEMS device 100 and adequately support the MEMS device 100.

The MEMS device 100 comprises a die or chip 1 of semiconductor material, such as silicon, integrating a membrane 2 and electrical components (not shown). In detail, the die 1 has a first face 1a and a second face 1b and the membrane 2 is flush with the first face 1a (also defined hereinafter as "top face" of die 1). The membrane 2 (see also the top plan view of FIG. 7) is formed in a suspended region 3 separate from the rest of the die 1 (referred to hereinafter as "peripheral portion 8" of the die 1) through a trench 4 and supported by the peripheral portion 8 through elastic elements (also referred to as "springs 5").

In the example shown, the suspended region 3 and the trench 4 have a rectangular shape, in particular square, but other shapes, for example circular, may be envisaged. In the embodiment of FIG. 1, the suspended region 3 has a smaller thickness than the peripheral portion 8 of the die 1 so that an air gap 9 extends underneath the suspended region 3, laterally delimited by the peripheral portion 8 of the die 1.

Furthermore, the membrane 2 is delimited at the bottom by a buried cavity 6, which extends within the suspended region 3.

A cap 10 covers at the top the suspended region 3 (including the membrane 2), protects it from impact and external stresses and enables simplification of the manufacturing and assembly process, as described in greater detail hereinafter. The cap 10 is fixed to the first face 1a of the die 1 via bonding regions 11, for instance, of metal (Au, Sn, Cu, etc.) or glass frit, or polymeric materials, which are fixed to the peripheral portion 8 and extend over the top face 1a of the die, outside the trench 4. The cap 10 is then at a distance 12 from the cap 10 due to the thickness of the bonding regions 11. In addition, in a way not shown, the side of the cap 10 facing the suspended region 3 can be etched so as to form a cavity of the cap facing the face 1a of the die 1.

The die 1 is fixed, on its second face 1b, to a second die 15, which may incorporate a processing circuit, for example an ASIC. To this end, a first adhesive layer 16, of patternable material, such as a biadhesive film, for example a die-attach film (DAF), is arranged between the processing circuit 15 and the die 1. In the example shown, the die 1 is connected to the processing circuit 15 by wire connection 17, in a per se known manner.

In turn, the processing circuit 15 is fixed at the bottom to a support 20, for example an organic multilayer substrate, such as a bismaleimide-triazine (BT) layer of, e.g., land-grid-array (LGA) type, via a second adhesive layer 21, of patternable material, for example a biadhesive film, similar to that of the first adhesive layer 16. The processing circuit 15 is electrically connected to the support 20 by wire connections 22, in a per se known manner, and has an area (in top plan view) smaller than that of the support 20.

A hole 23 extends through the support 20, the second adhesive layer 21, the processing circuit 15, and the first adhesive layer 16 and sets the trench 4 in communication with the outside through the air gap 9, as explained in greater detail hereinafter.

A packaging material 25, for example a plastic material, such as resin, completely coats the die 1, the cap 10, and the processing circuit 15 and extends laterally flush with the support 20 so as to encapsulate and completely insulate the die from the external environment, except for the fluidic path including the hole 23.

In particular, as indicated, the top surface of the membrane 2 is fluidically connected to the outside of the packaged sensor 1 through the trench 4, the air gap 9, the hole 23, and the gap 103 and is sensitive to the pressure outside the MEMS device 100.

The membrane 2 is provided, in a per se known manner and not shown, with transducer elements, for instance, piezoresistive elements, which, upon detection of a deformation of the membrane 2 as a result of the pressure acting on the membrane 2 itself (and equal to the external pressure, as indicated), generate an electrical signal supplied to the processing circuit 15, which then generates an electrical signal indicating the detected pressure.

FIG. 2 shows a MEMS device 200 wherein the suspended region 3 has a projecting portion or stem 30, which extends into the air gap 9 towards the processing circuit 15 so that the total thickness of the suspended region 3 at the projecting portion 30 is substantially equal to that of the peripheral portion 8 of the die 1. In this case, the hole 23 is offset with respect to the suspended region 3, even though it is connected with the air gap 9 and the trench 4, in order to provide the fluidic path. In this way, the bottom portion 30 forms an element limiting the movement in a vertical direction of the suspended region 3 in the event of impact or impulsive stresses from outside, which could cause failure of the springs 5, by hitting upon the second die 15.

FIG. 3 shows a MEMS device 300 wherein the die 1 is thinned so that the peripheral portion 8 has the same thickness as the suspended region 3. Here, the first adhesive layer 16 also forms a spacer so that between the die 1 and the processing circuit 15 a gap is created that enables fluids (air, gases, liquids) outside the MEMS sensor 300 to reach the membrane 2. In this way, a separate element is not utilized for limiting the vertical displacement of the suspended region 3, rather the underlying processing circuit 15 forms a stop element for possible excessive oscillations caused by impact or other impulsive stresses.

The MEMS devices 100, 200 are manufactured as described hereinafter with reference to FIGS. 4-12.

As shown in FIG. 4, a first silicon wafer 40 is processed so as to form the buried cavities 6 that define the membranes 2 at the bottom. Formation of the buried cavities 6 may be obtained in different ways, for example, as taught in EP1577656.

Figure 5:
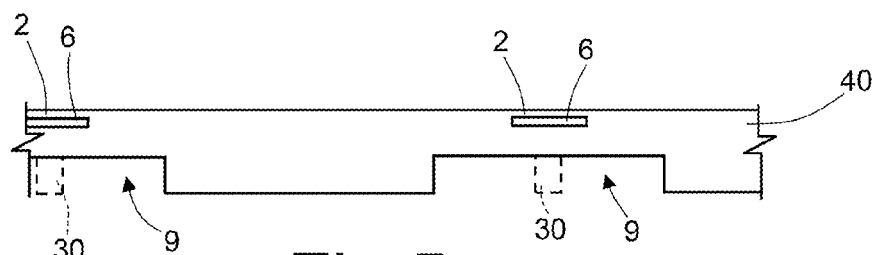

As shown in FIG. 5, the first wafer 40 is etched from the back, using an appropriate mask (not shown), to form the air gaps 9 under and at a distance from the buried cavity 6. For instance, etching may be carried out using dry processes such as deep silicon etching or in wet processes such as timed TMAH (tetramethyl-ammonium hydroxide).

Figure 6:
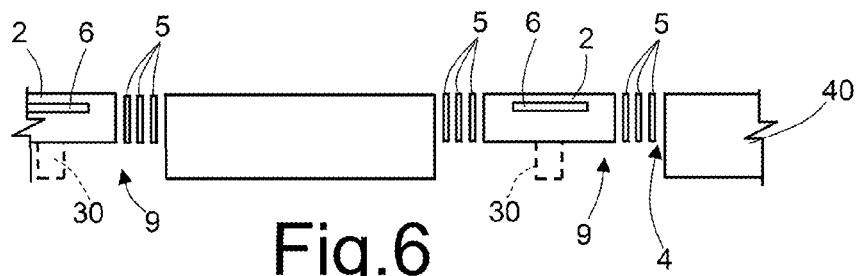
Figure 7:
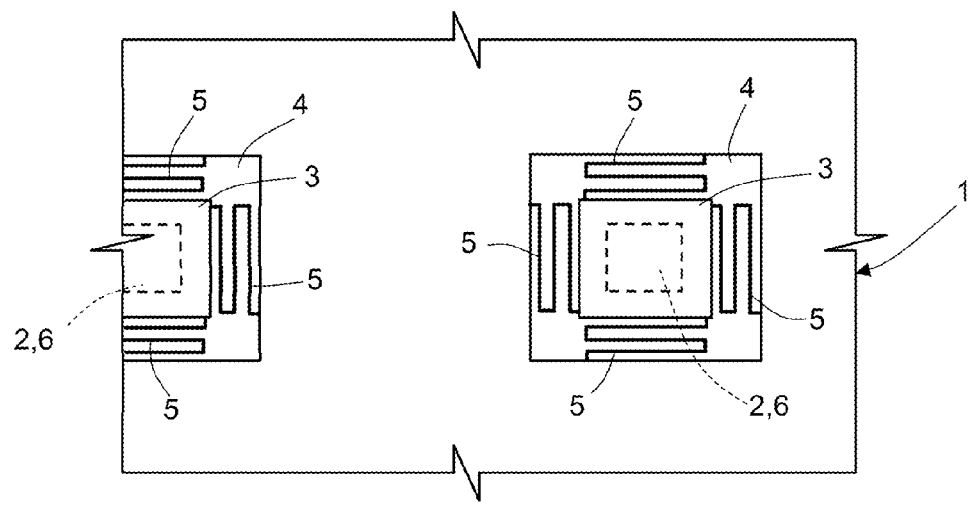
FIG. 7 is a top plan view of the structure of FIG. 4.

As shown in FIG. 6, the first wafer 40 is etched from the front by deep silicon etching so as to define the trenches 4 and the springs 5 and release the suspended regions 3, as may be seen also in the top plan view of FIG. 7.

As an alternative to the above, front etching of the first wafer 40 to define the trenches 4 and the springs 5 may be carried out prior to forming the air gaps 9, in practice reversing the flow described with reference to FIGS. 5 and 6. In this case, front etching may be timed to form the trenches (non-through trenches) as far as a given depth of the first wafer 40, and release of the suspended regions 3 is obtained while forming the air gaps 9, which extend as far as the trenches 4.

Figure 8:
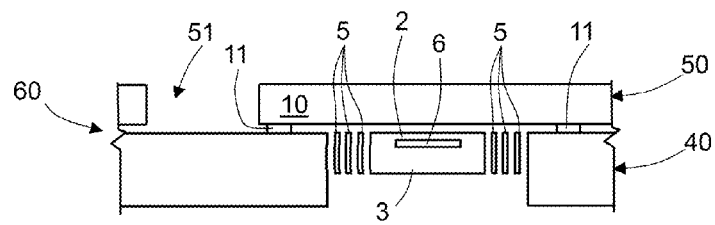

As shown in FIG. 8, a second wafer 50, having through cavities 51 of a rectangular shape, is fixed to the first wafer 40 using a known wafer-to-wafer bonding process, interposing the bonding regions 11.

A composite wafer 60 is thus obtained, where the through cavities 51 have the purpose of enabling access to the pads (not shown) used for the electrical wire connection 17.

Figure 9:
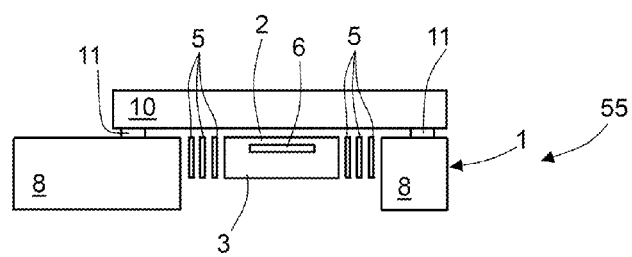
Figure 10:
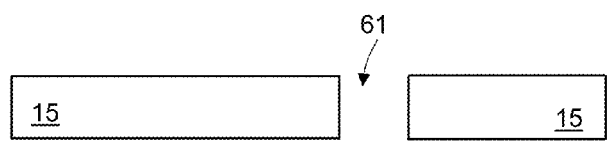

As shown in FIG. 9, the second wafer 50 is thinned through a grinding step, and the composite wafer 60 is diced so that the caps 10 are no longer connected to the rest of the second wafer 50. Consequently, a plurality of elements 55 is obtained, each formed by a die 1 and the corresponding cap 10.

Separately (FIG. 10), using normal semiconductor manufacturing techniques, the processing circuit (ASIC) 15 is formed and then perforated in an appropriate area, for example via deep reactive ion etching (DRIE) of epitaxial silicon or by laser or via sand jet. A hole 61 is thus formed, having, for example, a diameter in the order of 10-100 µm. The hole 61 may be formed at wafer level, for example via DRIE, or after dicing of the second die 15, for example by laser.

Figure 11:
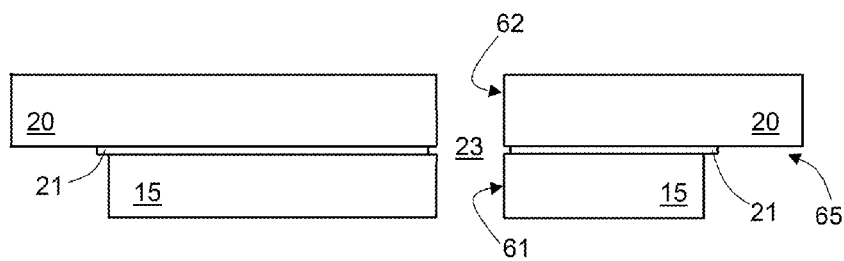

As shown in FIG. 11, the processing circuit 15 is fixed on the support 20, which is also provided with an own hole 62, so that the holes 61, 62 of the processing circuit 15 and of the support 20 are arranged on top of one another and form the hole 23 of FIG. 1. Etching is carried out by interposition of the second adhesive layer 21, already perforated, to obtain a stack 65, as represented in FIG. 11.

Figure 12:
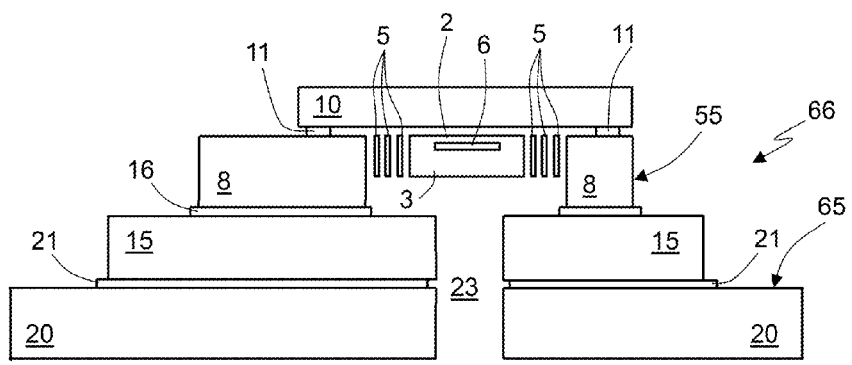

As shown in FIG. 12, the stack 65 is fixed to the element 55 to form a non-packaged pressure sensor 66.

Customary steps follow for forming the wire connections 17 and 22 (FIG. 1), and the package 25 is then molded. In particular, due to the absence of holes in the cap 10, molding may be carried out according to standard semiconductor techniques, avoiding complex techniques or bonding of pre-patterned caps for MEMS sensors of the type considered. The MEMS device 100/200 is thus obtained.

To manufacture the MEMS device 300 of FIG. 3, it is possible to perform steps like the ones described above, except for forming the cavity 9 as described with reference to FIG. 5. In fact, for MEMS sensor 300, this step is replaced by a thinning of the first wafer 40, which is generally carried out after fixing the first wafer 40 on the second wafer 50 and thus after forming the trench 4.

Figure 13:
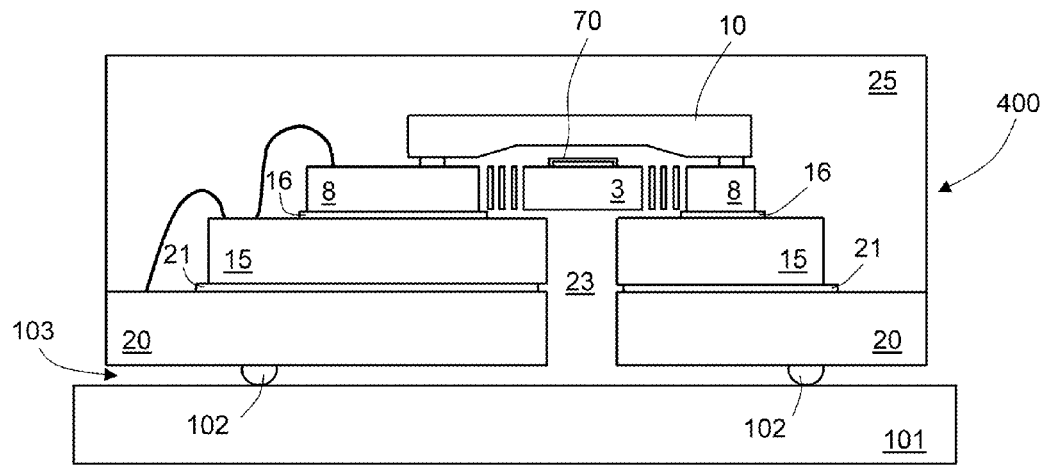
FIG. 13 is a cross-section of a different type of MEMS sensor.

FIG. 13 shows an embodiment wherein the membrane (here designated by 70) extends over the first face 1a of the die 1. In this case, the manufacturing process differs from the one described only as regards the formation of the membrane 70 (in a per se known manner), and for the rest comprises steps similar to those described for the MEMS device 100, 200 or 300.

Figure 14:
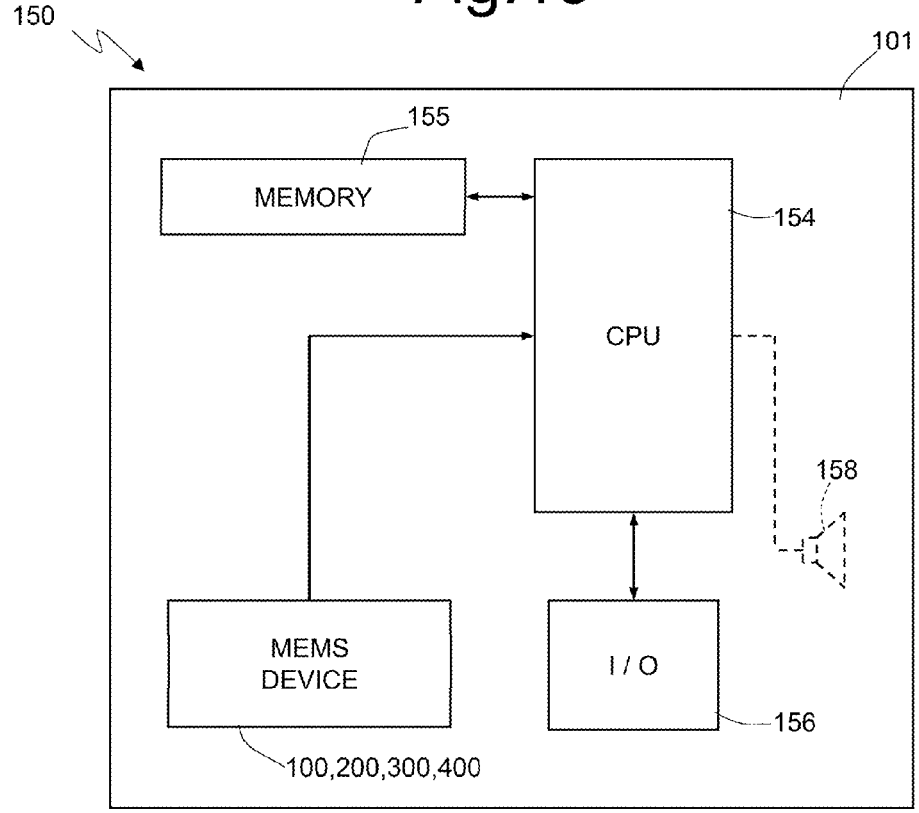
FIG. 14 shows an apparatus using the present device.

FIG. 14 is a schematic illustration of an electronic apparatus 150 that uses the MEMS device 100-400.

The electronic apparatus 150 comprises, in addition to the MEMS device 100-300, a microprocessor 154, a memory block 155, connected to the microprocessor 154, and an input/output interface 156, which is also connected to the microprocessor 154. Furthermore, a speaker 158 may be present, for generating a sound on one audio output (not shown) of the electronic apparatus 150.

In particular, the electronic apparatus 150 is fixed to the supporting body 101, here formed by a printed circuit, to which the MEMS device 100-300 and, moreover, the microprocessor 154 and the memory block 155 are mechanically and electrically coupled.

The electronic apparatus 150 is, for example, an apparatus for measuring blood pressure (sphygmomanometer), a household apparatus, a mobile communication device (cellphone, PDA, notebook) or an apparatus for measuring pressure that can be used in the automotive field.

The MEMS device 100-300 described herein has numerous advantages.

Due to the presence of the fluidic path formed by the hole 23, the trench 4, and possibly the air gap 9, as well as the gap 103, it is possible to expose the membrane 2 to the external environment even without the presence of a front hole in the cap 10. This considerably facilitates the molding operations of the package 25, since it is no longer necessary to protect the front hole during molding. It follows that molding can be carried out using a standard full-molding process, which is much less expensive and ensures a high yield.

Furthermore, as compared to the solutions where pre-patterned and glued caps are used, the final structure is more compact, which enables the use of the present MEMS sensor also in applications where space is critical.

Exposure to the external environment is obtained by keeping the membrane 2 on the front side (facing the cap 10) of the die 1, which enables use of known processes of surface machining of the silicon and implies a labyrinthine structure of the fluidic path. The labyrinthine structure reduces exposure of the membrane 2 to external contaminants, such as particles, dust, and moisture, which possibly get trapped along the fluidic path, without blocking it, and cannot reach the membrane 2. It follows that the reliability and robustness of the MEMS sensor are enhanced, due also to the monolithic structure of the present MEMS sensor.

The MEMS sensor moreover is exposed to the external environment in the bottom area, as desired in certain solutions of assembly on the supporting body 101, for example in the case of assembly on the board of a cellphone, with components mounted on an opposite side of the board and connected through holes in the board.

Separation between the peripheral portion 8 and the suspended region 3, and thus the membrane 2, of the die 1 due to the trench 4 prevents any assembly stresses from giving rise to deformation of the membrane and variation of the electrical parameters of the sensor, which would generate imprecision in reading.

Finally, it is clear that modifications and variations may be made to the MEMS sensor and to the manufacturing process described and illustrated herein, without thereby departing from the scope of the present disclosure.

For instance, the present MEMS sensor, instead of being a pressure sensor, could be a humidity sensor, a flow sensor, an environmental sensor (i.e., a combined pressure/humidity/temperature sensor), an air/gas sensor, a microfluidic device, or a miniaturized microphone.

The cap 10, as has been mentioned, could have a cavity forming a chamber overlying the membrane 2, as shown in FIG. 13, even though this entails an ad hoc processing operation. Furthermore, the cap 10 could be shaped so as to surround the die 1 and be fixed directly to the integrated circuit 15 or to the support 20.

The connections between the die 1 and the integrated circuit 15 might not be of the wire type; for example, it is possible to use through vias and/or connections from the back.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS device comprising:
   a first semiconductor die having a first face and a second face;
   a membrane formed in or on the first semiconductor die and at the first face;
   a cap coupled to the first face of the first semiconductor die with an inner surface of the cap facing and spaced apart from the membrane by a space, the cap having an outer surface opposite the inner surface;
   a support coupled to the first semiconductor die and facing the second face of the first semiconductor die;
   packaging material enclosing the outer surface the cap and portions of the first semiconductor die; and
   a fluidic path extending through the support and the first semiconductor die and fluidly coupling the membrane to an environment outside of the MEMS device.

2. The MEMS device according to claim 1, further comprising elastic elements, wherein the first semiconductor die includes a suspended region and a peripheral region that are separated from each other by a trench, the suspended region supporting the membrane and being coupled to the peripheral region by the elastic elements, wherein the elastic elements extend into the trench and are monolithic with the suspended region and the peripheral region.

3. The MEMS device according to claim 2, wherein the fluidic path comprises the trench, a first hole extending through the support, and the space between the membrane and the cap.

4. The MEMS device according to claim 3, further comprising a second semiconductor die located between the first semiconductor die and the support, the second semiconductor die having a second hole that is a part of the fluidic path, the second die including a processing circuit.

5. The MEMS device according to claim 2, wherein the suspended region has a first thickness and the peripheral region has second thickness, the first thickness being smaller than the second thickness, the MEMS device further comprising an air gap located underneath the suspended region and in the fluidic path.

6. The MEMS device according to claim 2 wherein the suspended region and the peripheral region have a same thickness, the MEMS device further comprising a spacer layer located over at least part of the second face of the first semiconductor die to form a gap that is a part of the fluidic path.

7. The MEMS device according to claim 1, wherein the first semiconductor device and the membrane together form at least one of a pressure sensor, a humidity sensor, a flow sensor, an environmental sensor, a gas sensor, a microfluidic device, and a miniaturized microphone.

8. The MEMS device according to claim 1, wherein the cap does not include any through holes, and the membrane is fluidly coupled the environment outside of the MEMS device only by the fluidic path.

9. An apparatus comprising:
a processing unit;
an input/output interface coupled to the processing unit;
a memory device coupled to the processing unit;
a circuit board; and
a plurality of adhesive regions;
a MEMS device secured to the circuit board by the plurality of adhesive regions, the plurality of adhesive regions being spaced apart from each other and forming gaps, the MEMS device including:
a first semiconductor die having a first face and a second face and a trench that extends from the first face to the second face;
a membrane formed in or on the first semiconductor die and at the first face;
a cap coupled to first face of the first semiconductor die, the cap having an inner surface facing and spaced apart from the membrane by a space and an outer surface that opposes the inner surface;
a support having a through hole coupled to the first semiconductor die and facing the second face of the first semiconductor die, the through hole of the support being in fluid communication with the trench of the first semiconductor die;
packaging material on the entire outer surface of the cap and portions of the semiconductor die; and
a fluidic path that includes the through hole of the support, the trench of the first semiconductor die, the gaps between the MEMS device and the circuit board, the fluidic path placing the membrane in fluid communication with an environment outside of the MEMS device.

10. The apparatus according to claim 9, wherein the plurality of adhesive regions are conductive adhesive regions.

11. The apparatus according to claim 9, further comprising a second semiconductor die located between the support and the first semiconductor die, the second semiconductor die being electrically coupled to the first semiconductor die and including an integrated circuit.

12. The apparatus according to claim 11, further comprising conductive wires, wherein the second semiconductor is electrically coupled to the first semiconductor die by the conductive wires.

13. A process for manufacturing a MEMS device, the method comprising:
coupling a cap to a first face of a first semiconductor die, the cap facing the first face of the first semiconductor die, and enclosing a space between inner surfaces of the cap and a membrane formed in or on the first semiconductor die at the first face;
coupling a support to the first semiconductor die, the support facing a second face of the first semiconductor die, wherein the support has a first opening and the first semiconductor die has a plurality of second openings that provide a fluidic path from the enclosed space to an environment outside of the MEMS device; and
forming a packaging material enclosing outer surfaces of the cap and portions of the first semiconductor die.

14. The process according to claim 13, comprises forming a trench through the first semiconductor die that extends between the first and second faces that separates a suspended region from a peripheral region, the suspended region supporting the membrane and being coupled to the peripheral region by elastic elements that are located in the trench.

15. The process according to claim 13, further comprising forming a cavity in the first semiconductor die that extends from the second face under the membrane and thinning the first semiconductor die.

16. The process according to claim 13, wherein coupling the cap to the first face the first semiconductor die is carried out at wafer level and includes forming a composite wafer by coupling a first semiconductor wafer that includes the first semiconductor die to a second semiconductor wafer that includes the cap, the process further including dicing the composite wafer to form a plurality of MEMS device.

17. The process according to claim 13, further comprising forming the first through hole in the support prior to coupling the support to the semiconductor die.

18. The process according to claim 13, further comprising:
forming a second through hole in a second semiconductor die;
coupling the second semiconductor die to the support with the first and second through holes aligned or overlapping; and
wherein coupling the support to the first semiconductor die comprises coupling the second semiconductor die to the second face of the first semiconductor die, and wherein the second through hole is part of the fluidic path.

* * * * *